United States Patent
Maa et al.

(10) Patent No.: US 6,767,802 B1
(45) Date of Patent: Jul. 27, 2004

(54) METHODS OF MAKING RELAXED SILICON-GERMANIUM ON INSULATOR VIA LAYER TRANSFER

(75) Inventors: Jer-Shen Maa, Vancouver, WA (US); Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/665,944

(22) Filed: Sep. 19, 2003

(51) Int. Cl.⁷ .......................... H01L 21/76; H01L 21/30
(52) U.S. Cl. ...................... 438/406; 438/458
(58) Field of Search .................. 438/455–459, 438/400, 404, 405, 406, 407, 412; 148/DIG. 12

(56) References Cited

U.S. PATENT DOCUMENTS

| | | | |
|---|---|---|---|
| 6,524,935 B1 * | 2/2003 | Canaperi et al. | 438/478 |
| 2001/0007790 A1 * | 7/2001 | Henley et al. | 438/514 |
| 2002/0096717 A1 * | 7/2002 | Chu et al. | 257/347 |
| 2003/0124815 A1 * | 7/2003 | Henley et al. | 438/460 |
| 2003/0199126 A1 * | 10/2003 | Chu et al. | 438/149 |

* cited by examiner

Primary Examiner—George Fourson
Assistant Examiner—Brook Kebede
(74) Attorney, Agent, or Firm—Matthew D. Rabdau; David C. Ripma

(57) ABSTRACT

Methods of forming a SiGe layer overlying an insulator are provided. A layer of SiGe is deposited on a substrate and implanted with ion to form a defect region within the SiGe material below its surface. The SiGe layer is then patterned and transferred by contact bonding to an insulator on a second substrate. After contact bonding the structure is annealed to split the SiGe layer along the defect region. The splitting anneal will relax the SiGe layer. Additional annealing at higher temperatures may be used to further relax the SiGe layer. A layer of strained silicon may then be epitaxial deposited on the resulting structure of relaxed SiGe on insulator. Another method provides for epitaxially depositing a layer of silicon over the SiGe layer prior to patterning. The silicon layer would then be bonded to the insulator on the second substrate. The splitting anneal and additional anneals, if any, should then induce strain into the silicon layer. The silicon layer would then remain over the insulator after the SiGe layer is removed.

21 Claims, 4 Drawing Sheets

Fig. 6
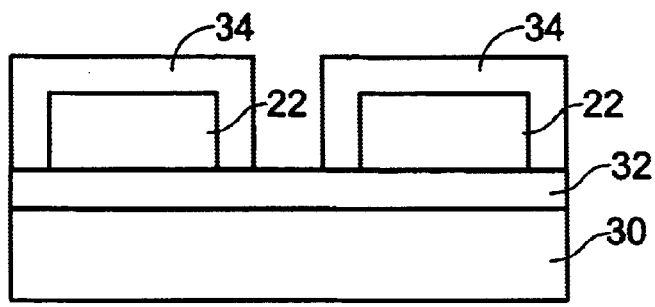
Fig. 7 RELAXATION OF SiGe ON SiO2 AFTER WAFER SPLITTING AND ANNEAL
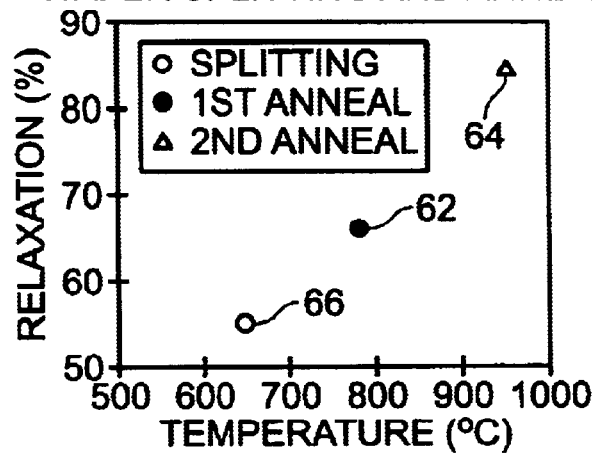
Fig. 8
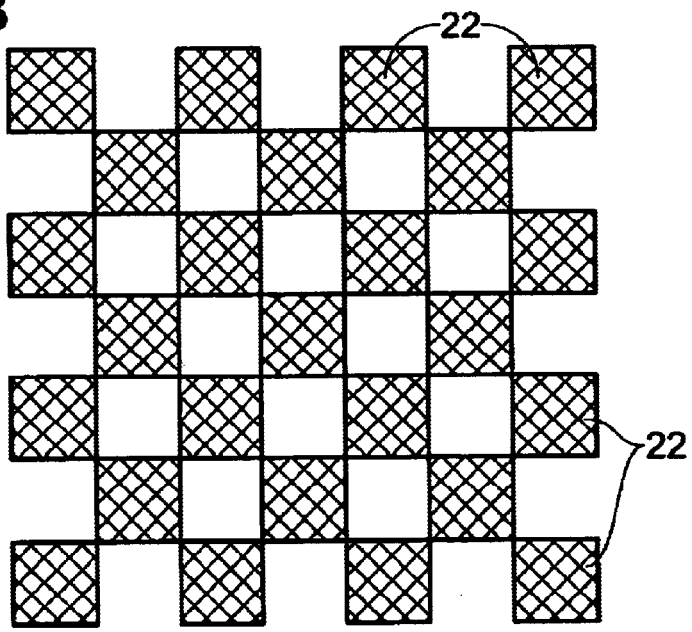

METHODS OF MAKING RELAXED SILICON-GERMANIUM ON INSULATOR VIA LAYER TRANSFER

BACKGROUND OF THE INVENTION

The present invention relates generally to methods of forming thin films and, more particularly, to methods of forming strained Si—Ge films or strained silicon films.

In strained Si films, the carrier transport properties are enhanced by biaxial tensile strain. Strained Si films may be formed by epitaxially depositing silicon on relaxed SiGe. Strained Si MOSFETs have been demonstrated using SiGe-on-insulator (SGOI) substrates. Strained silicon on SGOI substrates combine the high mobility of strained silicon with the advantages of an SOI-type structure in sub-100 nm devices.

Methods of fabricating SGOI substrates have been reported. A thick layer of SiGe is deposited on a silicon wafer, and includes a graded SiGe buffer layer and a relaxed SiGe layer with constant Ge concentration. The thick SiGe layer is then planarized using CMP. Hydrogen is then implanted into the SiGe layer to produce a defect zone, which is also referred to as a microcavity zone, for wafer splitting purposes. The surface of SiGe layer on the silicon wafer is then bonded to the surface of a silicon oxide layer on a second silicon wafer, using direct wafer bonding. A thermal anneal is then used to split the SiGe layer at the defect zone formed by the hydrogen implantation by inducing microcracks parallel to the bonding interface. The second silicon wafer now comprises a silicon substrate with an insulting silicon oxide layer and a strained SiGe layer, which corresponds to a SGOI substrate. Further polishing of the SiGe layer may be necessary to remove surface roughness caused by the remaining portion of the defect zone.

A method of producing a SiGe-free strained silicon film has also been described. This technique is similar to the methods above, with the additional steps of depositing a layer of epitaxial silicon on relaxed SiGe before hydrogen implanting and wafer bonding. After wafer bonding and splitting, the SiGe layer is removed leaving a layer of strained Si on a silicon oxide surface.

The above techniques all involve thicker SiGe layers than desired, and may require one or two elaborate CMP processes.

SUMMARY OF THE INVENTION

Accordingly, methods of forming a SiGe layer on an insulator are provided, in connection with methods of forming strained silicon films employing SiGe layers to induce strain. For example, a SiGe layer is formed on an insulator by providing a substrate, and depositing a layer of SiGe over the substrate. A defect region is then formed in the SiGe layer by ion implantation. The SiGe layer has a surface that is suitable for bonding to a surface of an insulator formed on a second substrate. Prior to bonding, however, the SiGe layer is patterned and etched to produce SiGe regions that are partially isolated from each other. This partial isolation is provided to reduce damage, such as flaking and blistering, that may be caused by subsequent annealing processes. The two substrates bonded together form a couplet. This couplet is then split along the defect region formed in the SiGe layer by annealing the couplet. The resulting structure has SiGe regions over an insulator on the second substrate. The substrate originally provided is no longer needed. Since the SiGe regions will preferably have been strained when formed, the splitting anneal and subsequent annealing will relax the SiGe regions.

If desired, silicon may be epitaxially formed over these relaxed SiGe regions, whereby the resulting silicon will be strained silicon. This would produce a structure comprising strained silicon over a relaxed SiGe layer over an insulator.

In another embodiment, a silicon layer is formed over the SiGe layer before transfer to the second substrate. A defect region is formed in the SiGe layer by implanting ions. The silicon layer and the SiGe layer are both patterned, and then the silicon layer is bonded to the insulator overlying the second substrate. As the SiGe layer is relaxed during the splitting anneal and any subsequent relaxation annealing steps, the relaxation of the SiGe layer should induce a strain in the silicon layer. Once the remaining SiGe layer is removed, a strained silicon over insulator structure should remain.

BRIEF DESCRIPTION OF THE DRAWINGS

FIGS. 1–6 are cross-sectional views showing steps in an embodiment of the present method.

FIG. 7 is a plot of SiGe relaxation as a function of temperature.

FIG. 8 is an example of an embodiment of a pattern formed in connection with the method.

DETAILED DESCRIPTION OF THE INVENTION

Figure 1:
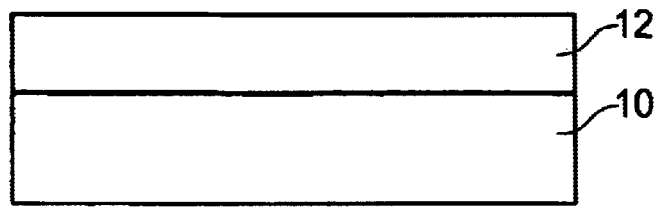

FIG. 1 is a cross-sectional view showing a silicon-germanium (SiGe) layer 12 overlying a silicon substrate 10. The SiGe layer has a thickness of between approximately 20 nm and 1000 nm. The SiGe layer is preferably a strained SiGe material, with a Ge concentration in the range of between approximately 10% and 60%. The SiGe layer may either have a graded Ge content, or a fixed Ge content.

Figure 2:
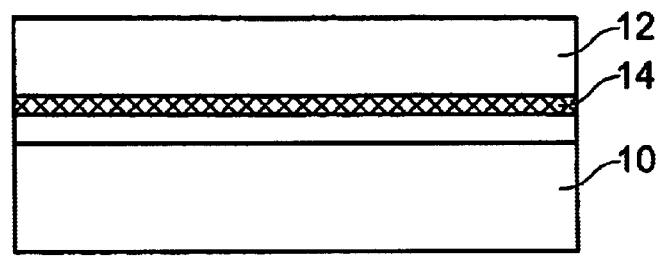

FIG. 2 illustrates the SiGe/Si structure following implantation of ions into the SiGe layer 12 to produce a defect region 14, preferably within the SiGe layer. The ions may be, for example, hydrogen, helium, or a combination of hydrogen and argon, helium, or boron. For example if hydrogen is used the ions could be either $H^+$ or $H_2^+$ at a dose range of between approximately $1\times10^{16}$ and $5\times10^{17}$ at an energy in the range of between approximately 1 keV and 300 keV. The defect region 14 corresponds to the area of highest implanted ion concentration.

Figure 3:
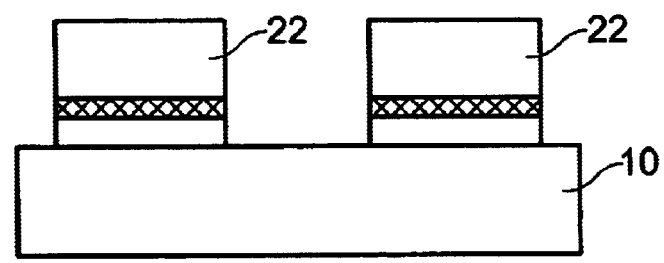

As shown in FIG. 3, the SiGe layer is patterned and etched. The resulting SiGe regions 22 can have dimensions ranging from submicron, for example 100 nm, to over 1 cm. Patterning the SiGe layer will reduce stresses produced in the SiGe film during subsequent processing. Reducing these stresses will reduce, or eliminate, blistering and flaking caused by subsequent relaxation processes.

Figure 4:
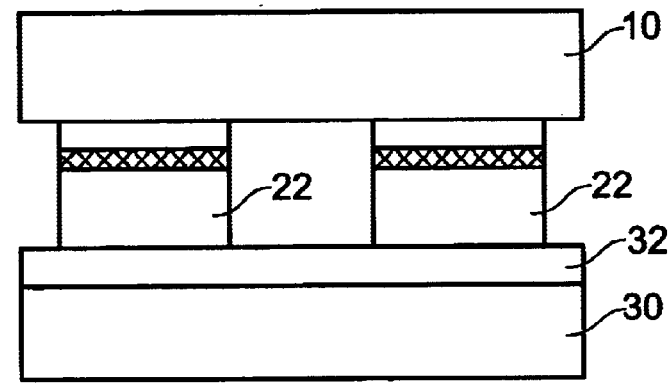

In an embodiment of the present method, the SiGe regions are now ready for contact bonding, without CMP polishing. In another embodiment, CMP polishing may be used to further prepare the SiGe regions for contact bonding. A second substrate with an insulator layer, of for example silicon oxide, is provided. The surface of the SiGe regions are placed in contact with the surface of the insulator layer and bonded to form a couplet. The couplet is formed via direct wafer bonding, such as hydrophilic bonding. In this procedure, the surfaces of both the SiGe regions and the insulator layer are cleaned in a modified SC-1 cleaning solution (H$_2$O:H$_2$O$_2$:NH$_4$OH=5:1:1) and rinsed in distilled H$_2$O. After spin drying both surfaces are hydrophilic. The dried wafers are brought into contact at ambient temperature. The bonding is initialized in a small area by pressing slightly. The bonded area spreads through the interface of both wafers in a few seconds forming a bonded couplet. The resulting couplet 28 is shown in FIG. 4. For purposes of illustration, the wafer comprising the SiGe regions 22 is shown flipped upside down over the substrate 30 with an insulator layer 32, such that SiGe regions 22 are in contact with the insulator layer 32. Although, a method of cleaning and bonding the wafers has been described above, other methods of contact bonding may be employed using different cleaning chemicals, or processes.

Figure 5:
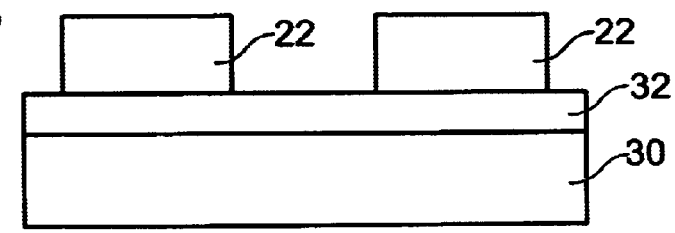

The couplet is then split by thermally annealing the couplet at a temperature of between approximately 350° C. and 700° C., for between about 30 minutes and four hours. The thermal annealing process apparently splits the SiGe layer at the defect zone formed by the hydrogen implantation by inducing microcracks parallel to the bonding interface. After splitting, portions of the SiGe regions 22 remain bonded to the insulator layer 32 overlying the substrate 30, as shown in FIG. 5. The remaining portion of the couplet is no longer need for further processing, and may either be reused or discarded.

The process of annealing to split the couplet will partially relax the SiGe regions 22. Additional annealing at higher temperatures may also be used to further relax the SiGe regions 22 after splitting. FIG. 7 shows relaxation as a function of temperature. The open circle 60 corresponds to the relaxation following a splitting process at 650° C. The solid green dot 62 corresponds to approximately one hour of post splitting annealing at 780° C. The red triangle 64 corresponds to the relaxation after additional annealing at 950° C. for approximately 30 minutes.

Following the splitting anneal of the couplet, a layer of silicon 34 may be epitaxially deposited over the SiGe regions 22, as shown in FIG. 6. In one embodiment the SiGe regions 22 are first relaxed beyond approximately 50% relaxation, and preferably beyond approximately 75% relaxation, prior to depositing the layer of silicon 34. By epitaxial forming silicon on relaxed SiGe, the silicon formed will be strained Si. In an alternative embodiment, the layer of silicon is deposited after splitting, and then additional relaxation annealing is applied to further relax the SiGe. Although the splitting anneal may relax the SiGe so that the silicon deposited will be strained, additional relaxation of the SiGe should induce further strain into the deposited silicon layer.

FIG. 8 illustrates the patterned SiGe following relaxation anneal. For purposes of illustration a checkerboard pattern is used in this example. Other shapes and patterns are possible. The SiGe is patterned and etched so that SiGe regions 22 are formed. During the relaxation annealing process residual stress propagates to the edges of these features thereby reducing, or eliminating, flaking and blisters in the SiGe material. The checkerboard pattern shown in FIG. 8 has demonstrated reduction, or elimination, of flaking or blistering using both a 4 µm×4 µm pattern, and a 16 µm×16 µm pattern. Areas of relaxed SiGe as large as 125 µm×125 µm have been formed without apparent flaking or blistering. It is expected that areas greater than 1 cm×1 cm are possible.

The two patterns described, and shown, are for illustration purposes only. A wide variety of patterns may be employed to reduce, or eliminate, stress induced damage due to the SiGe transfer and relaxation process.

Figure 9:
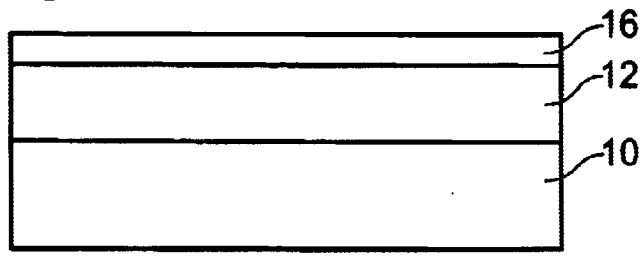
FIGS. 9–14 are cross-sectional views showing steps in an embodiment of the present method.

Another embodiment of the method for transferring a patterned, strained SiGe for the purpose of forming strained silicon is also provided. FIG. 9 is a cross-sectional view showing a silicon-germanium (SiGe) layer 12 overlying a silicon substrate 10. The SiGe layer has a thickness of between approximately 20 nm and 1000 nm. The SiGe layer is preferably a strained SiGe material, with a Ge concentration in the range of between approximately 10% and 60%. The SiGe layer may either have a graded Ge content, or a fixed Ge content. An epitaxial silicon layer 16 is deposited over SiGe layer 12. The epitaxial silicon layer 16 is preferably between approximately 10 nm and 25 nm thick.

Figure 10:
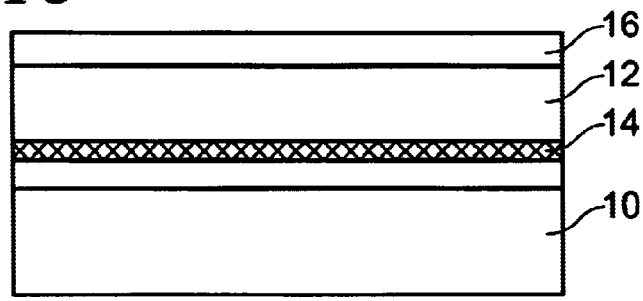

FIG. 10 illustrates the Si/SiGe/Si structure following implantation of ions into the SiGe layer 12 to produce a defect region 14, preferably within the SiGe layer. The ions may be, for example, hydrogen; helium, or a combination of hydrogen and argon, helium, or boron. For example if hydrogen is used the ions could be either H$^+$ or H$_2^+$ at a dose range of between approximately $1\times10^{16}$ and $5\times10^{17}$ at an energy in the range of between approximately 1 keV and 300 keV. The defect region 14 corresponds to the area of highest implanted ion concentration.

Figure 11:
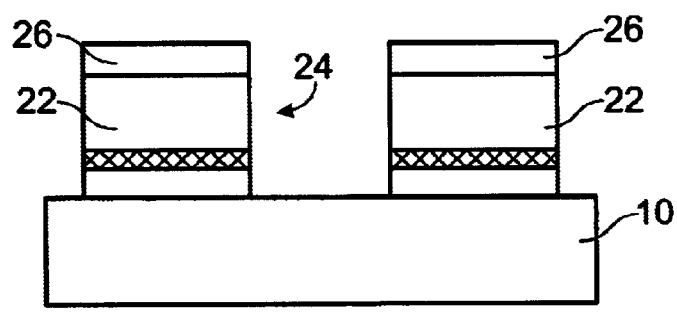

As shown in FIG. 11, the Si/SiGe stack is patterned and etched. The etching produces Si/SiGe stacks 24, comprising SiGe regions 22 and Si surface regions 26. The Si/SiGe stacks 24 can have dimensions ranging from submicron, for example 100 nm, to over 1 cm. Patterning the Si/SiGe stack will reduce stresses produced in the SiGe regions 22, and possibly the silicon regions as well, during subsequent processing. Reducing these stresses will reduce, or eliminate, blistering and flaking normally caused by subsequent relaxation processes.

Figure 12:
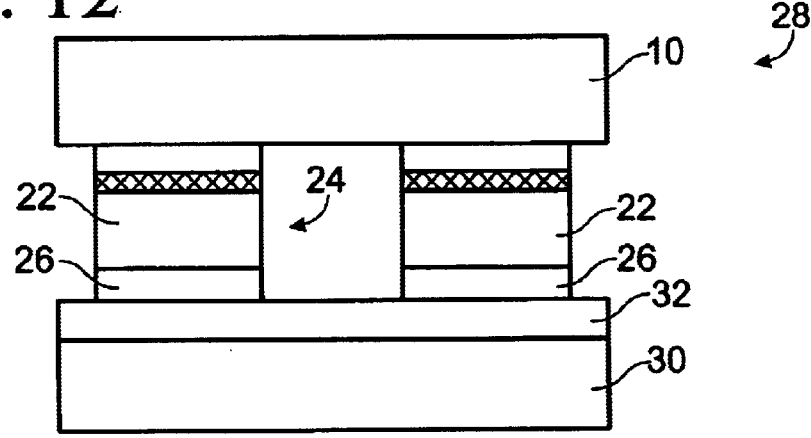

In an embodiment of the present method, Si surface regions 26 are now ready for contact bonding, without CMP polishing. In another embodiment, CMP polishing may be used to further prepare the Si surfaces regions 26 on the Si/SiGe stacks 24 for contact bonding. A second substrate with an insulator layer, for example silicon oxide, is provided. The Si surfaces regions 26 will be placed in contact with the surface of the insulator layer and bonded to form a couplet. The couplet is formed via direct wafer bonding, such as hydrophilic bonding. In this procedure, both the Si surface regions and the insulator layer are cleaned, for example in a modified SC-1 cleaning solution (H$_2$O:H$_2$O$_2$:NH$_4$OH=5:1:1) and rinsed in distilled H$_2$O. After spin drying both surfaces are hydrophilic. The dried wafers are brought into contact at ambient temperature. The bonding is initialized in a small area by pressing slightly. The bonded area spreads through the interface of both wafers in a few seconds forming a bonded couplet. The resulting couplet 28 is shown in FIG. 12. For purposes of illustration, the wafer comprising the Si/SiGe stacks 24 is shown flipped upside down over the substrate 30 with an insulator layer 32, such that Si surface regions 26 are in contact with the insulator layer 32. Although, a method of cleaning and bonding the wafers has been described above, other methods of contact bonding may be employed using different cleaning chemicals, or processes.

Figure 13:
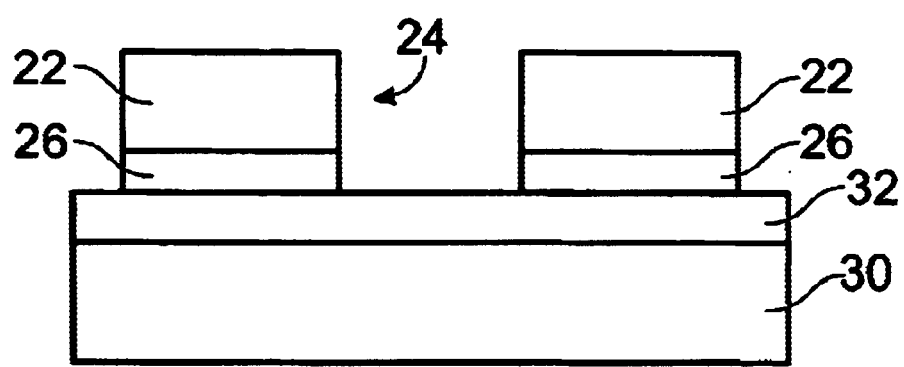

The couplet is then split by thermally annealing the couplet at a temperature of between approximately 350° C. and 700° C., for between about 30 minutes and four hours. The thermal annealing process apparently splits the SiGe layer at the defect zone formed by the ion implantation by inducing microcracks parallel to the bonding interface. After splitting, portions of the Si/SiGe stacks 24 remain with the Si surfaces 26 bonded to the insulator layer 32 overlying the substrate 30, as shown in FIG. 13. The remaining portion of the couplet is no longer need for further processing, and may either be reused or discarded.

The process of annealing to split the couplet will partially relax the SiGe regions 22. Additional annealing at higher temperatures may also be used to further relax the SiGe regions 22 after splitting. The relaxation of the SiGe regions 22 during the splitting anneal should induce strain in the Si surfaces 26. Additional, relaxation annealing will further relax the SiGe regions and should correspondingly increase the strain in the Si surfaces.

Figure 14:
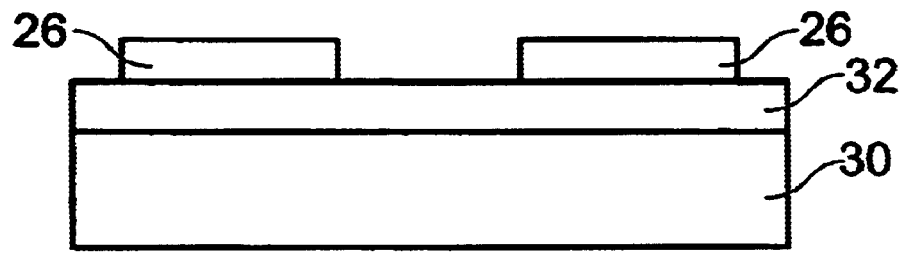

As shown in FIG. 14, once the SiGe regions have been relaxed a relaxation level of greater than approximately 50%, and preferably greater than 75%, the SiGe regions 22 are removed. The SiGe regions 22 can be removed, for example using a solution comprising $H_2O$, HCl and $H_2O_2$ (SC-1) at between approximately 25° C. and 80° C., leaving only the Si surface regions on the insulator. Due to the strain induced in the Si surface regions 26 by the relaxation of the SiGe regions 22, the remaining Si surface regions 26 should remain as strained silicon regions. This process provides a means of forming strained silicon on insulator.

Several embodiments have been provided as examples. The scope of the present invention should not be limited to these examples, and shall be determined by the following claims.

What is claimed is:

1. A method of forming a SiGe layer on an insulator comprising:
   providing a silicon substrate;
   depositing a SiGe layer with a surface on the silicon substrate, whereby a Si/SiGe interface is formed;
   implanting ions into the SiGe layer between the surface of the SiGe layer and the Si/SiGe interface, whereby a defect zone is formed;
   patterning and etching the SiGe layer, whereby a patterned SiGe layer is formed; and
   transferring the patterned SiGe layer to an insulator layer.

2. The method of claim 1, wherein the SiGe layer is a strained SiGe layer.

3. The method of claim 1, wherein the SiGe layer is a relaxed SiGe layer.

4. The method of claim 1, wherein the SiGe layer is between approximately 20 nm and 1000 nm thick.

5. The method of claim 1, wherein the layer of SiGe has a Ge concentration in the range of between approximately 10% and 60%.

6. The method of claim 4, wherein the layer of SiGe has a graded Ge concentration.

7. The method of claim 4, wherein the layer of SiGe has an essentially constant Ge concentration.

8. The method of claim 1, wherein the ions comprise ions of hydrogen, helium, or a combination of hydrogen and argon, helium or boron.

9. The method of claim 1, wherein the patterned SiGe layer comprises feature sizes between approximately 100 nm and 2 cm.

10. The method of claim 1, wherein transferring the patterned SiGe layer comprises bonding the surface of the patterned SiGe layer to an insulating layer on a second substrate to form a bonded couplet and thermally annealing the couplet to split the SiGe layer along the defect zone.

11. The method of claim 2, further comprising annealing the SiGe layer to relax the SiGe layer.

12. A method of forming a strained silicon film overlying an insulator comprising:
   providing a silicon substrate;
   depositing a strained SiGe layer with a surface on the silicon substrate, whereby a Si/SiGe interface is formed;
   implanting ions into the strained SiGe layer between the surface of the strained SiGe layer and the Si/SiGe interface;
   patterning and etching the strained SiGe layer, whereby a patterned, strained SiGe layer is formed;
   transferring the patterned, strained SiGe layer to an insulator layer;
   relaxing the strained SiGe layer, whereby the strained SiGe layer becomes a relaxed SiGe layer, and
   epitaxially forming a strained silicon film over the relaxed SiGe layer.

13. The method of claim 12, wherein the SiGe layer is between approximately 20 nm and 1000 nm thick.

14. The method of claim 12, wherein the layer of SiGe has a Ge concentration in the range of between approximately 10% and 60%.

15. The method of claim 14, wherein the layer of SiGe has a graded Ge concentration.

16. The method of claim 14, wherein the layer of SiGe has an essentially constant Ge concentration.

17. The method of claim 12, wherein the ions comprise ions of hydrogen, helium, or a combination of hydrogen and argon, helium or boron.

18. The method of claim 12, wherein the patterned SiGe layer comprises feature sizes between approximately 100 nm and 2 cm.

19. The method of claim 12, wherein transferring the patterned SiGe layer comprises bonding the surface of the patterned SiGe layer to an insulating layer on a second substrate to form a bonded couplet and thermally annealing the couplet to split the SiGe layer along the defect zone.

20. The method of claim 19, wherein relaxing the strained SiGe layer comprises additional thermal annealing.

21. A method of forming a SiGe-free strained silicon film on an insulator comprising:
   providing a silicon substrate;
   depositing a SiGe layer with a surface on the silicon substrate, whereby a Si/SiGe interface is formed;
   depositing a thin epitaxial silicon layer on the surface of the SiGe layer;
   implanting ions through the epitaxial silicon layer into the SiGe layer between the surface of the SiGe layer and the Si/SiGe interface;
   patterning and etching epitaxial silicon layer and the SiGe layer, whereby a patterned Si/SiGe stack is formed;
   transferring the patterned Si/SiGe stack to an insulator layer by bonding the epitaxial silicon layer to an insulating layer on a second substrate to form a bonded couplet and thermally annealing the couplet to split the SiGe layer along the defect zone, whereby patterned regions of SiGe over silicon over insulator is formed;
   relaxing the SiGe layer, whereby the epitaxial silicon becomes a strained silicon film;
   removing the SiGe layer.

* * * * *